Figure 1:
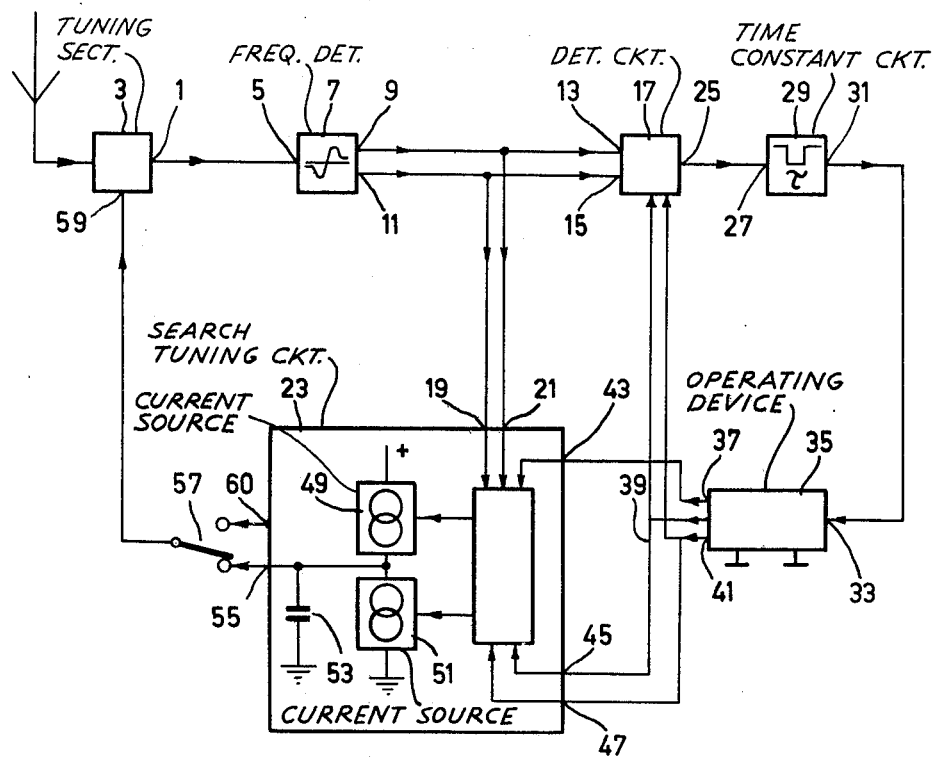

United States Patent [19]
Garskamp

[11] 3,968,441
[45] July 6, 1976

[54] RECEIVER TUNING CIRCUIT WITH AUTOMATIC SEARCH AND AFC USING COMMON CAPACITOR

[75] Inventor: Arnoldus Garskamp, Eindhoven, Netherlands

[73] Assignee: U.S. Philips Corporation, New York, N.Y.

[22] Filed: Sept. 27, 1974

[21] Appl. No.: 509,803

[30] Foreign Application Priority Data
Oct. 4, 1973  Netherlands.................... 7313625

[52] U.S. Cl............................. 325/420; 325/470
[51] Int. Cl.² ........................................ H04B 1/32
[58] Field of Search .............. 325/420, 468–471, 325/422, 423

[56] References Cited
UNITED STATES PATENTS

| | | | |
|---|---|---|---|
| 3,467,873 | 9/1969 | Buhr | 325/470 |
| 3,505,605 | 4/1970 | Buhr | 325/470 |
| 3,528,015 | 9/1970 | Buhr | 325/470 |
| 3,611,152 | 10/1971 | Sakai | 325/422 |
| 3,821,651 | 6/1974 | Fathauer | 325/470 |

*Primary Examiner*—George H. Libman
*Attorney, Agent, or Firm*—Frank R. Trifari; Henry I. Steckler

[57] ABSTRACT

A station finder which switches to automatic frequency control during automatic finding in case of reception of a transmitter and, if desired, continues to find a transmitter some time later with the frequency control switched off.

3 Claims, 2 Drawing Figures

RECEIVER TUNING CIRCUIT WITH AUTOMATIC SEARCH AND AFC USING COMMON CAPACITOR

The invention relates to a receiver tuning circuit including a search tuning circuit which can be activated by a control device in which the search tuning circuit is automatically switched off when a received station is detected by a detection circuit and an automatic frequency control circuit is switched on, and in which a time constant circuit changes the state of the receiver tuning circuit after a certain time.

A receiver tuning circuit of the kind described above is known from German Offenlegungsschrift 2,023,352 which after activation of the search tuning stops the search action when a transmitter transmitting a pilot signal is received and switches on an automatic frequency control circuit. The search tuning circuit must again be activated when the received transmitter is not desired. When a transmitter without a pilot signal is received, the search tuning circuit switches over to a slowed down searching action and the automatic frequency control remains switched off. The tuning circuit includes a time constant circuit which renders the detection circuit for the pilot signal inactive some time after the finder has been activated so that the circuit can then pull in on transmitters without a pilot signal.

This known tuning circuit is only suitable for special receivers. An object of the invention is to provide a tuning circuit which is more suitable for other receiver types.

To this end a receiver tuning circuit of the kind described in the preamble according to the invention is characterized in that the time constant circuit is incorporated in the tuning circuit in such a manner that again and again it switches on the search tuning circuit a certain time after having automatically switched it off and switches off the automatic frequency control as long as the search tuning circuit is maintained operative with the aid of the operating device.

By using the step according to the invention a receiver is obtained which upon activation of the search tuning circuit receives without distortion transmitter after transmitter each during a time determined by the time constant circuit. The search tuning can be rendered inactive with the aid of the operating device after the desired station has been found. The tuning circuit is very suitable for radio or television receivers for domestic use.

The invention will now be described with reference to the drawing.

Figure 2:
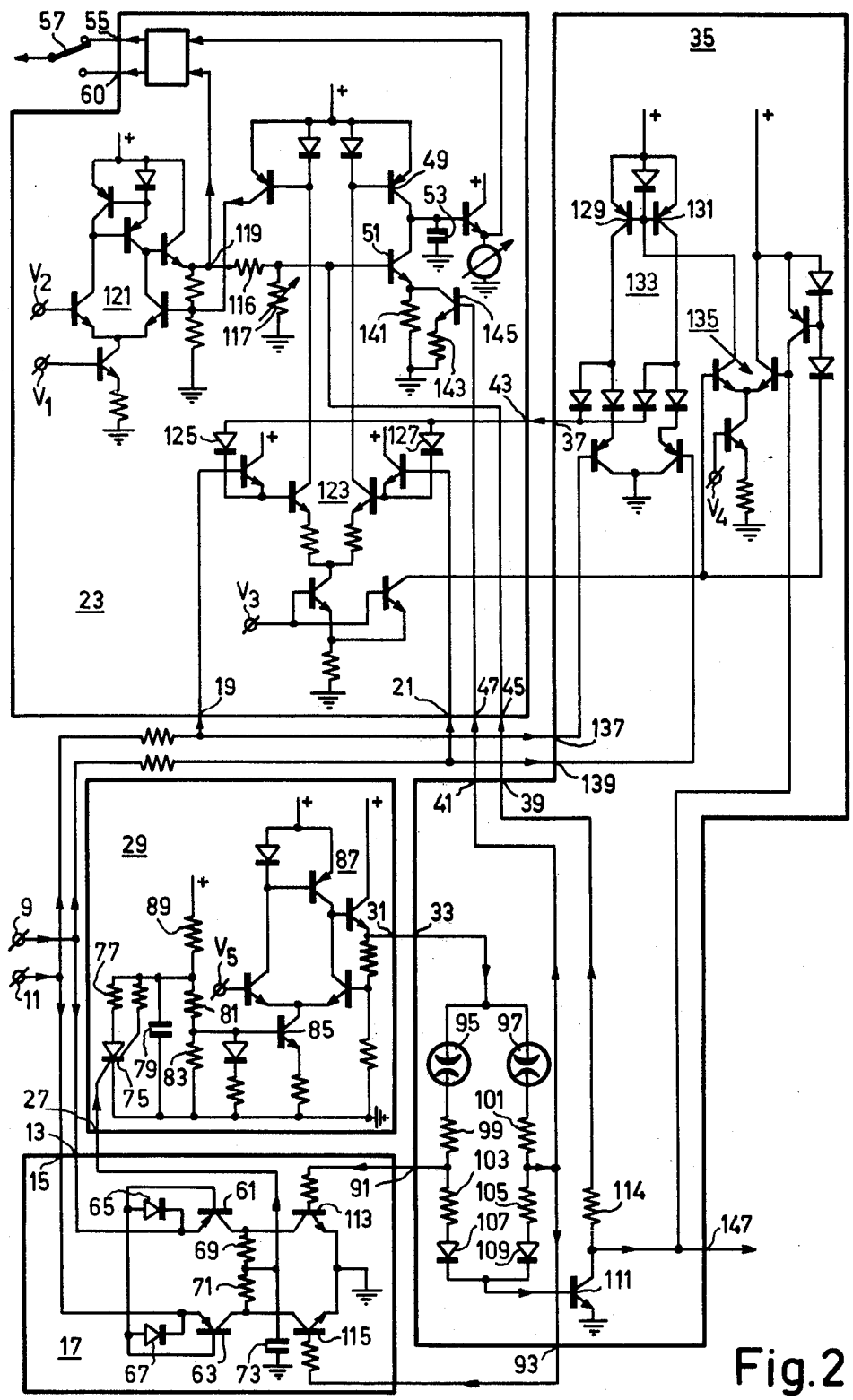

FIG. 1 is a block-schematic diagram of a tuning circuit according to the invention and FIG. 2 is a principle circuit diagram of part of a tuning circuit according to the invention.

In FIG. 1 an output of a tuning section 3 of a radio or television receiver comprising a high frequency and oscillator circuit tunable with a tuning voltage and an IF amplifier is connected to an input 5 of a tuning signal or frequency detector 7 applying to two outputs 9, 11 signals which are dependent on the tuning of the tuning section and vary in the opposite sense as a function of the frequency at which the tuning circuit 3 is tuned in case of reception of a transmitter.

The outputs 9 and 11 are connected to two inputs 13 and 15 of a detection circuit 17 and furthermore to two inputs 19 and 21 of a search tuning circuit 23. The detection circuit 17 has an output 25 at which in case of almost correct tuning of the tuning section 3 a signal is produced which is applied to an input 27 of a time constant circuit 29. This time constant circuit 29 applies a signal to an output 31 during some time, for example, approximately 1.5 sec. which signal is applied to an input 33 of an operating device 35.

The operating device 35 applies signals to three outputs 37, 39, 41 which signals are dependent on the signal at the input 33 and on the operation of one or more operating members of the device. These signals are applied to three inputs 43, 45, 47 of the station finder 23.

The station finder 23 has two current sources 49, 51 a common point of which is connected to a capacitor 53. These current sources 49, 51 can influence the charge of the capacitor 53 and hence the voltage at an output 55 connected thereto which output is connected through a switch 57 to a tuning signal input 59.

The current sources 49 and 51 are controlled by signals applied to the inputs 19, 21, 43, 45 and 47 of the station finder.

When operating an operating member of the operating device 35 signals are applied to the inputs 45 and 47 which cause a continuous increase or decrease of the voltage at the capacitor 53 dependent on the direction in which a given frequency range is to be searched with the tuning section 3. A signal is then applied to the input 43 which renders automatic frequency control signals at the inputs 19, 21 inactive. When a transmitter is received these automatic frequency control signals are rendered active due to the signal occurring for 1.5 seconds at the input 33 of the operating device 35 and searching through the frequency range is discontinued. The voltage at the capacitor 53 is then determined by an automatic frequency control so that a station found is immediately correctly tuned to and reproduced in an undistorted manner. After 1.5 seconds the searching action of the circuit is continued unless it has been indicated with the aid of an operating member of the operating device 35 that the tuning section 3 must remain tuned to the received transmitter. In this manner the listener or viewer will be able to judge successively all transmitters for 1.5 seconds, if desired, and make his choice easily.

The switch 57 serves to tune the receiver, if desired, manually to a number of transmitters for which the tuning voltages can be obtained from an output 60 of the search tuning circuit 23.

FIG. 2 uses the same reference numerals as in FIG. 1 for corresponding components.

The detection circuit 17 has two pnp transistors 61, 63, whose emitters are connected to the inputs 13 and 15 and their bases are interconnected and are connected through two diodes 65 and 67 to the relevant emitters. It is assumed that the circuit is in the station finding state. When the voltage at the input 13 is higher than that at the input 15, the base-emitter path of the transistor 61 and the diode 67 conduct and in case of reversal of the polarity of the voltage difference at the inputs 13, 15 the base-emitter path of the transistor 63 and the diode 65 conduct. When the voltage difference between the inputs 13 and 15 is low, neither of the two transistors 61, 63 conducts; the latter is for example the case as long as no station is received. When a station is received, the highest of the voltages at the inputs 13, 15 is applied through one of the transistors 61 or 63 and a collector resistor 69 or 71 thereof to the input 27 of the time constant circuit 29 connected to the connection of the resistors 69, 71. A capacitor 73 connected to the input 27 serves for suppressing possible interference occurring in the signal at the input 27. The voltage at the input 27 of the time constant circuit 29 then causes a thyristor 75 to conduct which very quickly discharges a capacitor 79 through a resistor 77. The voltage at the capacitor 79 is then so low that a current source 85 of a stabilizing circuit 87 connected through a potential divider 81, 83 to the capacitor 79 is blocked so that the voltage at the output 31 of the time constant circuit drops out and returns when the capacitor 79 is charged again through a resistor 89. The latter takes approximately 1.5 seconds.

For 1.5 seconds after detection of the reception of a station the voltage at the input 33 of the operating device 35 is low. The voltage then also remains low at two outputs 91 and 93 which are connected to potential dividers each comprising operating contacts 95 and 97, which as shown can be touch contacts, resistors 99, 101, resistors 103, 105 and diodes 107, 109, respectively, and are located between the input 33 and the base of an npn transistor 111. Two npn transistors 113, 115 in the detection circuit 17 whose bases are connected to the outputs 91 and 93 of the operating device 35 and whose collectors are connected to the resistors 69 and 71 and the collectors of the transistors 61 and 63 remain cut off during these 1.5 seconds as well as transistor 111.

The collector of the transistor 111 is connected through a resistor 114, the output 39 and the input 45 to the base of an npn transistor arranged as a current source 51. This base is connected to a tap on a potential divider 116, 117 which is located between an output 119 of a stabilizing circuit 121 and ground. When the transistor 111 is cut off, the transistor 51 conveys a current which is adjusted with the aid of resistor 117 in such a manner that in case of correct tuning of the receiver the capacitor 53 maintains its voltage because in that case the transistor 49 whose base is connected to an output of a frequency control signal amplifier 123 supplies as much current as is taken up by transistor 51. Due to the control signals at the inputs 19 and 21 the current through transistor 49 is dependent on the tuning of the receiver and corrects the voltage at the capacitor 23 in case of incorrect tuning until it has become correct. This automatic frequency control can operate during the said period of 1.5 seconds because two diodes 125 and 127 which are connected through the input 93 to the output 37 of the operating device 35 are then also blocked so that the control signal amplifier 123 can supply the base current of transistor 49. The voltage at the output 37 is not high because two pnp transistors 129, 131 of a gating circuit 133 are cut off because their bases do not receive any currents through a switch 135 which is blocked by the high collector voltage of the transistor 111.

When after the said period of 1.5 seconds of tuning to a found station one of the operating contacts 95 or 97 is operated, the transistor 111 starts to conduct because its base is fed through one of these contacts from the input 33 which then has become positive again. The switch 135 then causes the transistors 129, 131 of the gating circuit 133 to conduct so that the control signal amplifier 123 is fed with an input voltage through the diodes 125, 127, which voltage does not exhibit any difference between the two inputs of this amplifier and which is higher than the highest voltage at the inputs 19 and 21 due to the operation of the gating circuit 133 which has two inputs 137, 139 to which the voltages at the inputs 19 and 21 are also applied.

Due to the operation of one of the contacts 95, 97 one of the transistors 113 or 115 also becomes conducting. The transistors 61, 63 are still cut off at that instant because there was a correct tuning during the said 1.5 seconds due to the automatic frequency control. When again starting the searching action one of the transistors 61 or 63 will start to conduct as a result of the then occurring detuning. The voltage at the input 27 will, however, not be able to increase due to the conductance of the relevant transistor 113 or 115 so that the same station cannot be pulled in.

Restarting of the finding action is affected because in the case where the contact 95 is operated only the transistor 111 starts to conduct and the current through the transistor 51 is reduced through the resistor 141 so that the voltage at the capacitor 53 starts to increase. When the contact 97 is operated the voltage at the base of transistor 51 is also reduced, but also its emitter resistor 141 is shunted by a resistor 143 because a transistor 145 in series with this resistor starts to conduct due to the voltage at its base which is fed from the potential divider 101, 105, 109 in series with the contact 97. The current through the transistor 51 will then become larger so that the voltage at the capacitor 53 will decrease and a finding action in another direction takes place than in the case of operating the contact 95.

The collector of transistor 111 furthermore applies a voltage to an output 147 which can be used for blocking the sound section of the receiver during the finding action.

It will be evident that instead of a detection circuit 17 which is active on an output signal of a frequency detector, alternatively a detection circuit active on another signal, for example, a pilot signal can be used.

Instead of the simple operating contacts 95 and 97 bistable circuits may be used which, as desired, can be brought to one or the other state with the aid of an operating contact.

Also the supply of the operating contacts from the time constant circuit is of course not essential. This switch may act in all kinds of manners on the operating device so that the intended effect is utilized of retaining a station found during a searching action for a certain time, for example, approximately 1.5 seconds and tuning this station immediately in a correct manner. The said time may of course be chosen to be different, if desired.

The tuning circuit described as an embodiment may be built up in a simple manner with the aid of an integrated circuit TCA 750.

What is claimed is:

1. A receiver tuning circuit for a tuner comprising means for detecting the presence of a received signal having an input means for coupling to said tuner; a search tuning circuit having a capacitor means for a tuning voltage for said tuner, and an automatic frequency control circuit coupled to said capacitor; said tuning circuit and said automatic frequency control circuit charging said capacitor when activated; an operating device means coupled to said detecting means and said search tuning circuit for activation of said search tuning circuit and for subsequent deactivation of said search tuning circuit and activation of said automatic frequency control circuit upon detection of a received signal; and time constant circuit means coupled between said detecting means and said operating device means for repeatedly activating said search tuning circuit and deactivating said automatic frequency control circuit a selected time after said search tuning circuit has been deactivated.

2. A receiver tuning circuit as claimed in claim 1, wherein said operating device has a supply lead and the time constant circuit is coupled to the supply lead of the operating device.

3. A receiver tuning circuit as claimed in claim 1, wherein the detection circuit is coupled to an output of a frequency detector and includes a means for preventing pulling in on the same transmitter upon activation of said search tuning circuit.

\* \* \* \* \*

UNITED STATES PATENT AND TRADEMARK OFFICE
CERTIFICATE OF CORRECTION

PATENT NO. : 3,968,441
DATED : July 6, 1976
INVENTOR(S) : Arnoldus Garskamp

It is certified that error appears in the above–identified patent and that said Letters Patent are hereby corrected as shown below:

Claim 1, line 4, after "for" insert -- providing --;

Signed and Sealed this

Twenty-third Day of November 1976

[SEAL]

Attest:

RUTH C. MASON
*Attesting Officer*

C. MARSHALL DANN
*Commissioner of Patents and Trademarks*